(12) United States Patent
Lakkis

(10) Patent No.: US 7,853,862 B2
(45) Date of Patent: Dec. 14, 2010

(54) SYSTEMS AND METHODS FOR A TURBO LOW-DENSITY PARITY-CHECK DECODER

(75) Inventor: Ismail Lakkis, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 736 days.

(21) Appl. No.: 11/462,241

(22) Filed: Aug. 3, 2006

(65) Prior Publication Data

US 2007/0043998 A1     Feb. 22, 2007

Related U.S. Application Data

(60) Provisional application No. 60/705,277, filed on Aug. 3, 2005.

(51) Int. Cl.
*G06F 11/00* (2006.01)
(52) U.S. Cl. .................................. 714/800
(58) Field of Classification Search ............ 714/777, 714/800–801, 807
See application file for complete search history.

(56) References Cited

U.S. PATENT DOCUMENTS

| | | | |
|---|---|---|---|
| 3,703,705 A * | 11/1972 | Patel | 714/757 |
| 3,745,526 A * | 7/1973 | Hong et al. | 714/777 |
| 5,425,038 A | 6/1995 | Chen | |
| 6,715,121 B1 | 3/2004 | Laurent | |
| 7,178,080 B2 | 2/2007 | Hocevar | |
| 7,246,304 B2 | 7/2007 | Kim | |
| 7,395,490 B2 | 7/2008 | Richardson et al. | |
| 2008/0263425 A1 | 10/2008 | Lakkis | |

FOREIGN PATENT DOCUMENTS

WO     07019187     2/2007

OTHER PUBLICATIONS

Min-Seok Oh et al., Scalable LDPC coding for OFDMA, Aug. 13, 2004, IEEE 802.16 Broadband wireless access working group, <http://ieee802.org/16> retrived from google.com on Mar. 9, 2010, p. 1 to 10.*
International Preliminary Report on Patentability- PCT/US2006/030145, The International Bureau of WIPO- Geneva, Switzerland.
Written Opinion- PCT/US2006/030145, International Search Authority- US, Jul. 12, 2007.
International Search Report- PCT/US2006/030145, International Search Authority- US, Jul. 12, 2007.
M. Mansour et al., "High-Throughput LDPC Decoders," IEEE Transactions on Very Large Scale Integration systems, vol. 11, No. 6, Dec. 2003.

(Continued)

*Primary Examiner*—Shelly A Chase
(74) *Attorney, Agent, or Firm*—Dang M. Vo

(57) ABSTRACT

A method for forming a plurality of parity check matrices for a plurality of data rates for use in a Low-Density Parity-Check (LDPC) decoder, comprises establishing a first companion exponent matrix corresponding to a first parity check matrix for a first data rate, and partitioning the first parity check matrix and the first companion exponent matrix into submatrices such that the first parity check matrix is defined using a cyclical shift of an identity matrix.

25 Claims, 21 Drawing Sheets

OTHER PUBLICATIONS

Guilloud, "Architecture generique de decodeur de codes LDPC," Jul. 2, 2004, These Presentee Pour Obtenir Le Grade de Docteur de L'Ecolenationel Superieure Des Telecommunications, XP002370625.

Richardson, et al., "Efficient Encoding of Low-Density Parity-Check Codes," Feb. 1, 2001, IEEE Transactions on Information Theory, US, XP011027880.

Sha, et al., "Efficient Decoder irnpienentation for QC-LDPC Codes," Jun. 1, 2006. Communications, Circuits and Systems Proceedings, 2006 International Conference on, IEEE, PI, pp. 2498-2502, XP031010935.

Yadav, et al., "Design and Implementation of LDPC Codes for DVB-S2," , 2005, Conf. record of the 39th Asilomer Conf. on Signals, Systems and Computers, Oct. 28-Nov. 1, 2005, USA, pp. 723-728, XP010900097.

International Search Report - PCT/US09/046175, International Searching Authority - European Patent Office, Oct. 8, 2009.

Written Opinion—PCT/US09/046175, International Searching Authority—European Paient Office, Oct. 8, 2009.

* cited by examiner

| | 1 | 2 | 3 | 4 |
|---|---|---|---|---|
| 1 | 0 | 0 | 0 | $J^3$ |
| 2 | 0 | 0 | $J^6$ | 0 |
| 3 | $J^6$ | 0 | 0 | 0 |
| 4 | 0 | $J^{35}$ | 0 | 0 |
| 5 | $J^{23}$ | 0 | 0 | 0 |
| 6 | 0 | 0 | 0 | $J^{10}$ |
| 7 | 0 | $J^{15}$ | 0 | 0 |
| 8 | 0 | 0 | $J^{31}$ | 0 |
| 9 | 0 | $J^{22}$ | 0 | 0 |
| 10 | 0 | 0 | 0 | $J^{24}$ |
| 11 | $J^{13}$ | 0 | 0 | 0 |
| 12 | 0 | 0 | $J^{34}$ | 0 |
| 13 | 0 | 0 | $J^{30}$ | 0 |
| 14 | 0 | $J^{27}$ | 0 | 0 |
| 15 | 1 | 0 | 0 | 0 |
| 16 | 0 | 0 | 0 | $J^{11}$ |
| 17 | $J^{14}$ | 0 | 0 | 0 |
| 18 | 0 | 0 | $J^{29}$ | 0 |
| 19 | 0 | $J^{19}$ | 0 | 0 |
| 20 | 0 | 0 | 0 | $J^{18}$ |
| 21 | 0 | $J^{21}$ | 0 | 0 |
| 22 | 0 | 0 | 0 | $J^{35}$ |
| 23 | $J^7$ | 0 | 0 | 0 |
| 24 | 0 | 0 | J | 0 |
| 25 | 0 | 0 | $J^4$ | 0 |
| 26 | $J^{22}$ | 0 | 0 | 0 |
| 27 | 0 | $J^8$ | 0 | 0 |
| 28 | 0 | 0 | 0 | $J^9$ |
| 29 | 0 | $J^{11}$ | 0 | 0 |
| 30 | $J^{24}$ | 0 | 0 | 0 |
| 31 | 0 | 0 | 0 | $J^{30}$ |
| 32 | 0 | 0 | J | 0 |

FIG. 7

$$\mathbf{E}^{1,1}_{12} = \begin{array}{|c|c|c|c|} \hline \infty & \infty & \infty & 3 \\ \hline \infty & \infty & 6 & \infty \\ \hline 6 & \infty & \infty & \infty \\ \hline \infty & 35 & \infty & \infty \\ \hline \end{array}$$

Exponent sub-matrix $$\mathbf{H}^{1,1}_{12} = \begin{array}{|c|c|c|c|} \hline 0 & 0 & 0 & J^3 \\ \hline 0 & 0 & J^6 & 0 \\ \hline J^6 & 0 & 0 & 0 \\ \hline 0 & J^{35} & 0 & 0 \\ \hline \end{array}$$

Corresponding Parity-check sub-matrix

SYSTEMS AND METHODS FOR A TURBO LOW-DENSITY PARITY-CHECK DECODER

RELATED APPLICATION INFORMATION

This application claims priority under 35 U.S.C. 119(e) to U.S. Provisional Application Ser. No. 60/705,277, entitled "Turbo LDPC," filed Aug. 3, 2005, which is incorporated herein by reference in its entirety as if set forth in full.

BACKGROUND

1. Field of the Invention

The embodiments described herein are related to methods for Low-Density Parity-Check decoding and more particularly to methods for achieving efficient and cost-effective Low-Density Parity-Check decoders.

2. Background of the Invention

A Low-Density Parity-Check (LDPC) code is an error correcting code that provides a method for transferring a message over a noisy transmission channel. While LDPC techniques cannot guaranty perfect transmission, they can be used to make the probability of lost information very small. In fact, LDPC codes were the first to allow data transmission rates at close to the theoretical maximum, e.g., the Shannon Limit. LDPC techniques use a sparse parity-check matrix, e.g, a matrix populated mostly with zeros; hence the term low-density. The sparse matrix is randomly generated subject to defined sparsity constraints.

LDPC codes can be defined in matrix and graphical form. An LDPC matrix will have a certain number of rows (N) and columns (M). The matrix can also be defined by the number of 1's in each row ($w_r$) and the number of 1's in each column ($w_c$). For a matrix to be considered low-density, the following conditions should be met: $w_c \ll N$ and $w_r \ll M$. An LDPC matrix can also be regular or irregular. A regular LDPC matrix, or code is one in which $w_c$ is constant for every column and $w_r = w_c*(N/M)$ is also constant for every row. If the matrix is low-density, but the number of 1's in each row or column are not constant, then such codes are called irregular LDPC codes.

It will also be understood that an LDPC code can be graphically defined by its corresponding Tanner graph. Not only do such graphs provide a complete representation of the code, they also help to describe the decoding algorithm as explained in more detail below. The nodes of the graph are separated into two distinctive sets called variable nodes (v-nodes) and check nodes (c-nodes). Thus, the Tanner graph will consist of M check nodes (the number of parity bits) and N variable nodes (the number of bits in a code word). A check node will then be connected to a variable node if there is a 1 in the corresponding element of the LDPC matrix.

The number of information bits can be represented as (K). Accordingly, the number of parity check bits M=N−K. A Generator Matrix ($G_{N \times K}$) can then be defined according to the following:

$G_{N \times K} = c_{N \times 1}/d_{K \times 1}$ or $c_{N \times 1} = G_{N \times K} d_{K \times 1}$, where $d_{K \times 1}$ = a message or date word, and $c_{N \times 1}$ = a code word.

As can be seen, the code word $C_{N \times 1}$ is generated by multiplying the message by the generator matrix. The subscripts refer to the number of rows and columns, respectfully. Thus, the data word and code word can be represented as single-column matrices with K and N rows, respectively.

The parity check Matrix can be defined as $H_{M \times N} c_{N \times 1} = 0$.

Accordingly, FIG. 1 is a diagram illustrating a system 100 that includes a transmitter and a receiver. A portion 102 of the transmitter and a portion 110 of the receiver are shown for simplicity. Referring to FIG. 1, an encoder 104 converts a data word $d_{K \times 1}$ into a code word $c_{N \times 1}$ via application of the generator matrix $G_{N \times K}$. Modulator 106 can be configured to then modulate code word $c_{N \times 1}$ onto a carrier so that the code word can be wirelessly transmitted across channel 108 to the receiver.

In receive portion 110, demodulator 112 can be configured to remove the carrier from the received signal; however, channel 108 will add channel effects and noise, such that the signal produced by demodulator 112 can have the form: $r_{N \times 1} = 2/\sigma^2 (1-2 c_{N \times 1}) + w_{N \times 1}$, where r is a multilevel signal. As a result of the noise and channel effects, some of the data bits d will be lost in the transmission. In order to recover as much of the data as possible, decoder 114 can be configured to use the parity check matrix $H_{M \times N}$ to produce an estimate $\hat{d}_{K \times 1}$ of the data that is very close to the original data $d_{K \times 1}$. It will be understood that decoder 114 can be a hard decision decoder or a soft decision decoder.

Unfortunately, conventional LDPC decoding techniques result in a high complexity, fully parallel decoder implementation where all the messages to and from all the parity node processors have to be computed at every iteration in the decoding process. This leads to large complexity, increased research requirements, and increased cost. Serializing part of the decoder by sharing a number of parity node processors is one option for reducing some of the overhead involved; however, serializing part of the decoder imposes stringent memory requirements to store the messages, resulting in an interconnection complexity bottleneck, i.e., complex interconnects between variable node, processors and parity node processors. Accordingly, serializing part of the decoder does not solve all of these problems.

Further, if different data rates are to be supported, then the decoder becomes even more complex in terms of memory size, memory architecture, and interconnect complexity. In general, another problem with conventional LDPC decoders is that the computations performed by the parity node processors are highly complex. Accordingly, these computations limit the speed of the decoder and increase its size and cost.

SUMMARY

An LDPC decoder comprises a highly structured parity-check matrix that supports variable rates, while still maintaining limited complexity. The LDPC decoder implements resource sharing that reduces the number of parity node processors in a highly efficient manner. The LDPC encoder also comprises an efficient and small memory architecture and reduces interconnect complexity.

In one aspect, compression and decompression algorithms are used to store and retrieve messages from memory.

These and other features, aspects, and embodiments of the invention are described below in the section entitled "Detailed Description."

BRIEF DESCRIPTION OF THE DRAWINGS

Features, aspects, and embodiments of the invention are described in conjunction with the attached drawings, in which:

FIG. 5 is a diagram illustrating an example exponential matrix configured in accordance with one embodiment;

FIG. 6 is a diagram illustrating an example parity check matrix in accordance with one embodiment;

FIG. 7 is a diagram illustrating an example sub-matrix used to construct the parity check matrix of FIG. 6 in accordance with one embodiment;

FIG. 8 is a diagram illustrating further sub-matrices used to construct the parity check matrix of FIG. 6 in accordance with one embodiment;

FIG. 9 is a diagram illustrating further sub-matrices that includes the sub-matrices of FIG. 8 used to construct the parity check matrix of FIG. 6 in accordance with one embodiment;

FIG. 17 is a diagram illustrating an exponential matrix constructed in accordance with one embodiment;

FIG. 18 is a diagram illustrating the construction of an exponential sub-matrix in accordance with one embodiment;

FIG. 19 is a diagram illustrating a parity check matrix for a ¾ data rate constructed in accordance with one embodiment;

FIG. 21 is a diagram illustrating a parity check matrix for a ⅞ data rate constructed in accordance with one embodiment.

DETAILED DESCRIPTION

In the descriptions that follow, certain example parameters, values, etc., are used; however, it will be understood that the embodiments described herein are not necessarily limited by these examples. Accordingly, these examples should not be seen as limiting the embodiments in any way. Further, the embodiments of an LDPC decoder described herein can be applied to many different types of systems implementing a variety of protocols and communication techniques. Accordingly, the embodiments should not be seen as limited to a specific type of system, architecture, protocol, air interface, etc. unless specified.

In order to illustrate the use of LDPC codes, the following parity check matrix H is employed:

$$H_{3\times 6} = \begin{bmatrix} 1 & 0 & 1 & 0 & 1 & 0 \\ 0 & 1 & 0 & 1 & 0 & 1 \\ 1 & 1 & 0 & 0 & 0 & 1 \end{bmatrix}$$

As can be seen, the example parity check matrix H is low density, or sparse. The first row of matrix H defines the first parity check node, or equation. As can be seen, the first parity check node will check received samples $r_0$, $r_2$, and $r_4$, remembering that r is the multilevel signal produced by demodulator 112 in the receiver. The second parity check node, i.e., the second row of H, checks for received samples $r_1$, $r_3$, and $r_5$, and the third parity check node checks samples $r_0$, $r_1$, and $r_5$. In this example, there are three parity check nodes and six samples. The first and second parity check nodes are considered orthogonal, because they involve mutually exclusive sets of samples.

If it is assumed that K=3 and M=3, then the following is true:

$$H_{3\times 6}c_{6\times 1} = 0 \Leftrightarrow H_{3\times 6}\begin{bmatrix} d_{3\times 1} \\ p_{3\times 1} \end{bmatrix} = 0 \Leftrightarrow \begin{bmatrix} 1 & 0 & 1 & 0 & 1 & 0 \\ 0 & 1 & 0 & 1 & 0 & 1 \\ 1 & 1 & 0 & 0 & 0 & 1 \end{bmatrix}\begin{bmatrix} d_0 \\ d_1 \\ d_2 \\ p_0 \\ p_1 \\ p_2 \end{bmatrix} = 0$$

This produces the following equations:

$d_0+d_2+p_1=0$ $d_1+p_0+p_2=0$ $d_0+d_1+p_2=0$

These equations reduce to:

$p_0=d_0$ $p_1=d_0+d_2$ $p_2=d_0+d_1$

Thus, for example, if d=[0;1;0], then p=[0;0;1] and c=[0;1;0;0;0;1].

Figure 1:
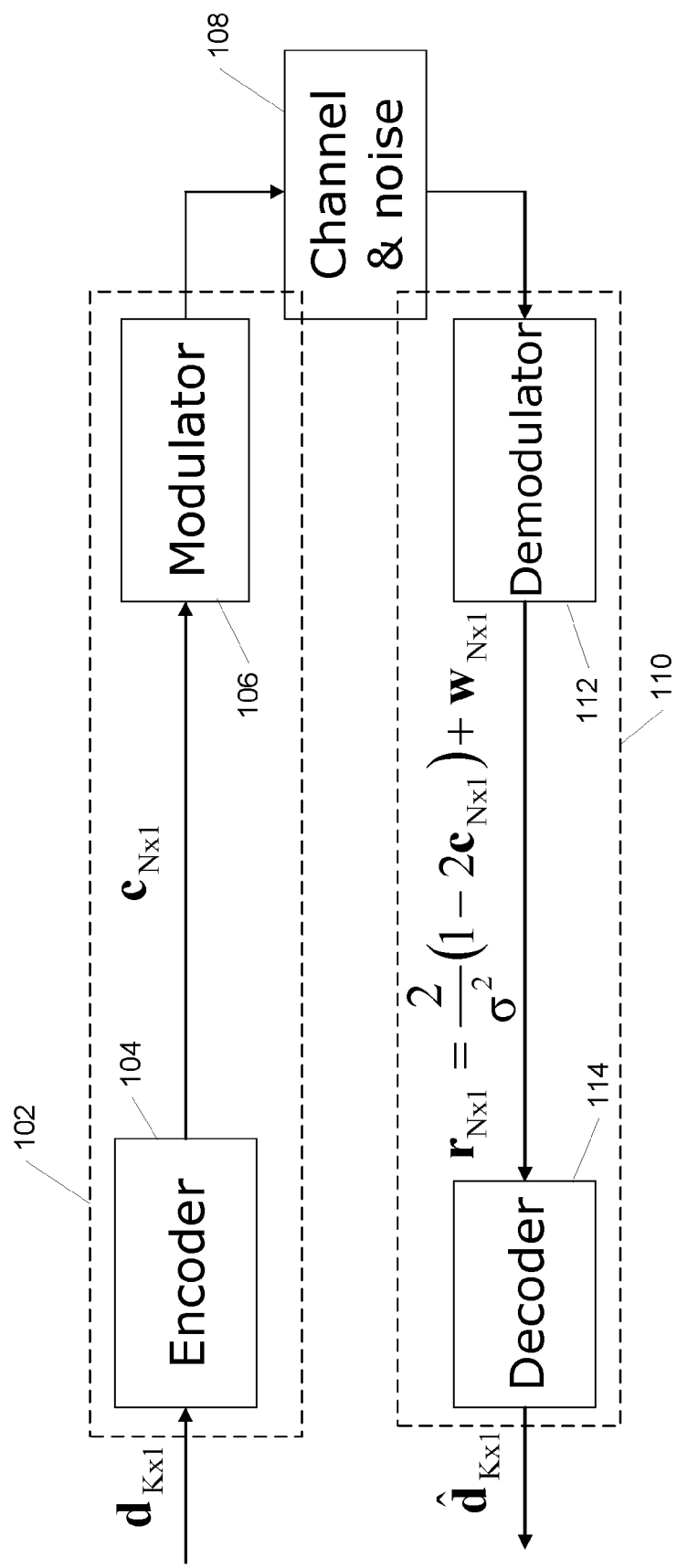
FIG. 1 is a diagram illustrating an example communication system that uses LDPC codes.
Figure 2:
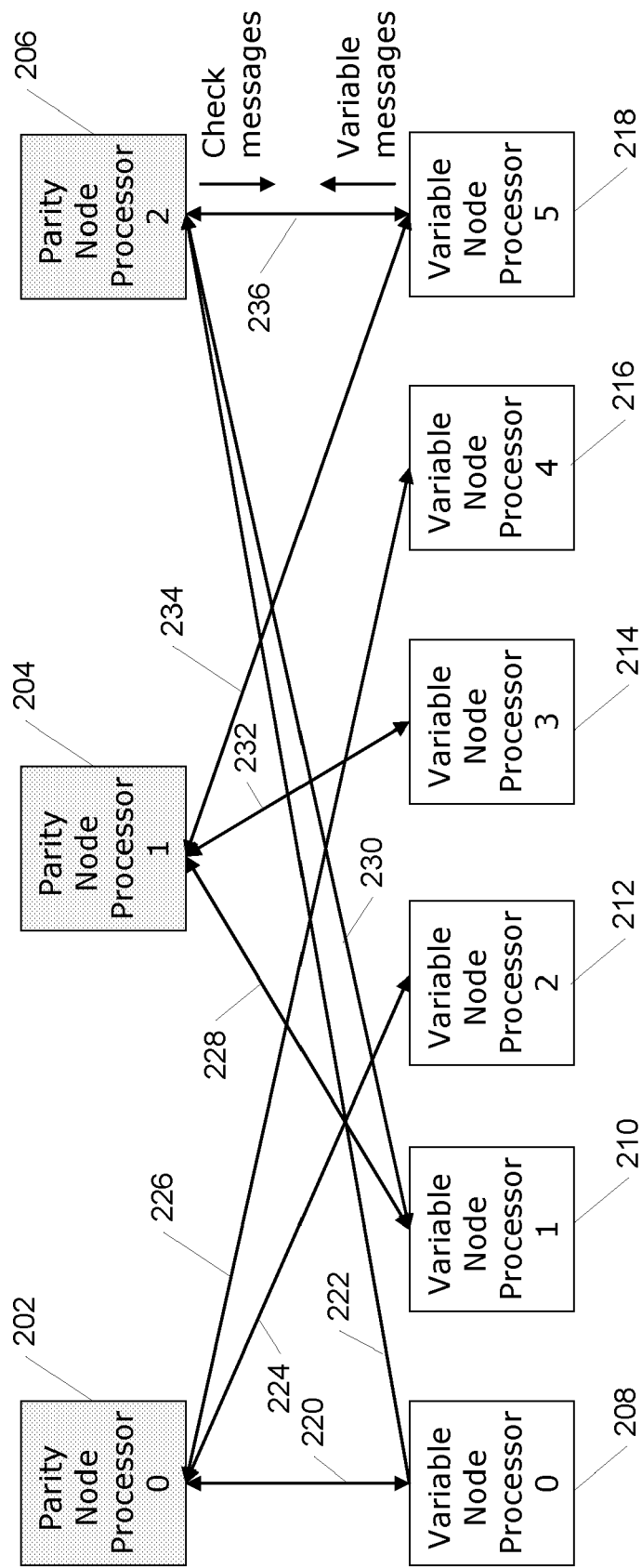
FIG. 2 is a diagram illustrating the operation of an exemplary parity check matrix.

FIG. 2 is a diagram illustrating the operation of H in the example above. As can be seen, the graph of FIG. 2 has three parity check nodes 202, 204, and 206, and 6 variable nodes 208, 210, 212, 214, 216, and 218, which correspond to the bits of c. Parity check nodes 202, 204, and 206 are connected to variable nodes 208, 210, 212, 214, 216, and 218, via edges 220, 222, 224, 226, 228, 230, 232, 234, and 236 as dictated by the entries in H. In other words, each edge 220, 222, 224, 226, 228, 230, 232, 234, and 236 should correspond to a 1 in H.

In an LDPC decoder, the operations of the parity check and variable nodes can be implemented by processors. In other words, each parity check node can be implemented by a parity check processor, and each variable check node can be implemented by a variable node processor. An LDPC decoder is then an iterative decoder that implements a message-passing algorithm defined by H.

Figure 3:
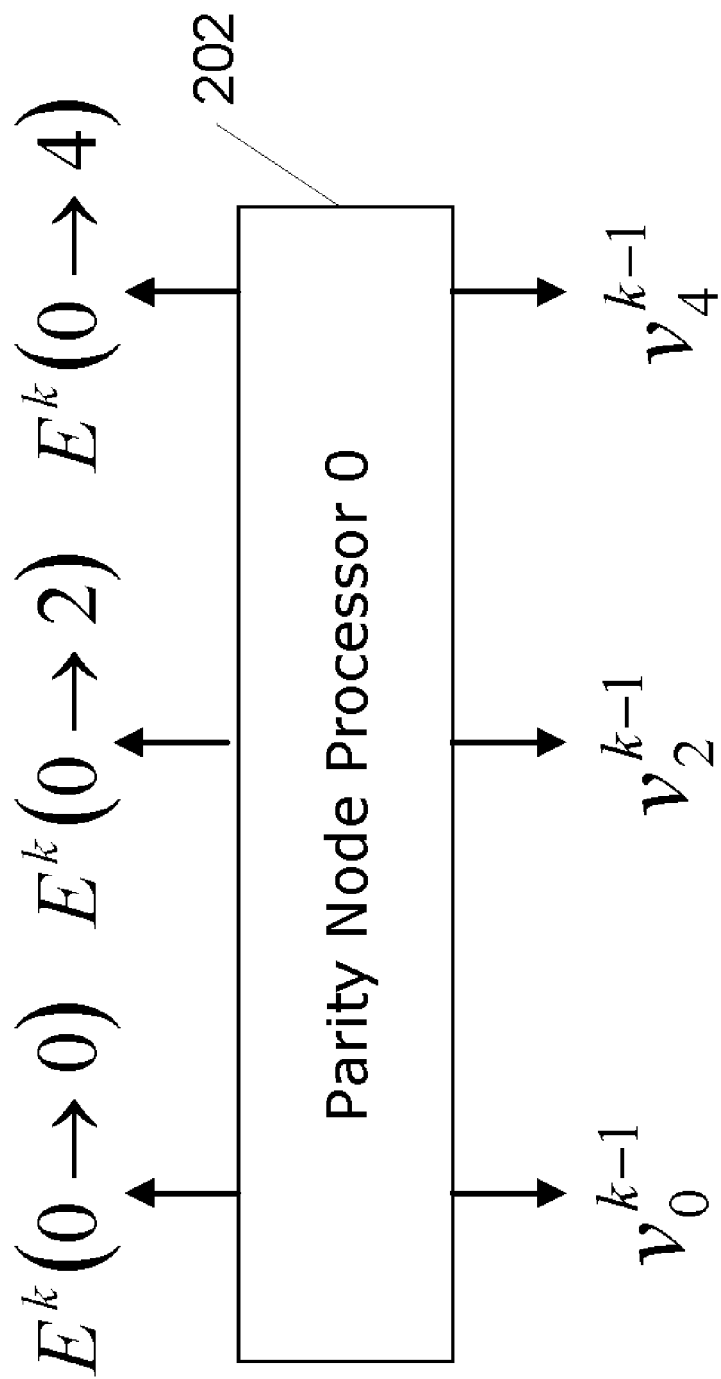
FIG. 3 is a illustrating the operation of an exemplary parity node processor.

FIG. 3 is a diagram illustrating the operation of parity node processor 202. First, the LDPC decoder will initialize the variable data bits $v_0$, $v_1$, $v_2$ ... $v_6$ of variable node processors 208, 210, 212, 214, 216, and 218 with $r_0$, $r_1$, $r_2$, ... $r_6$. Referring to FIG. 3, $v^{k-1}_0$, $v^{k-1}_2$, and $v^{k-1}_4$ are the variable messages sent from variable nodes 208, 210, 212, 214, 216, and 218 to parity node processor 202. Parity node processor 202 operates on these messages and computes its messages $E^k$. For example, $E^k(0\to 2)$ represents the message sent from parity node 202 to variable node 212 at the kth iteration.

The messages produced by parity node processor 202 can be defined using the following equations:

$$E^k(0 \to 0) = 2\tanh\left[\tanh\left(\frac{v_2^{k-1}}{2}\right)\tanh\left(\frac{v_4^{k-1}}{2}\right)\right]$$

$$E^k(0 \to 2) = 2\tanh\left[\tanh\left(\frac{v_0^{k-1}}{2}\right)\tanh\left(\frac{v_4^{k-1}}{2}\right)\right]$$

$$E^k(0 \to 4) = 2\tanh\left[\tanh\left(\frac{v_0^{k-1}}{2}\right)\tanh\left(\frac{v_2^{k-1}}{2}\right)\right]$$

Thus variable node processor 202 can be configured to implement the above equations.

Figure 4:
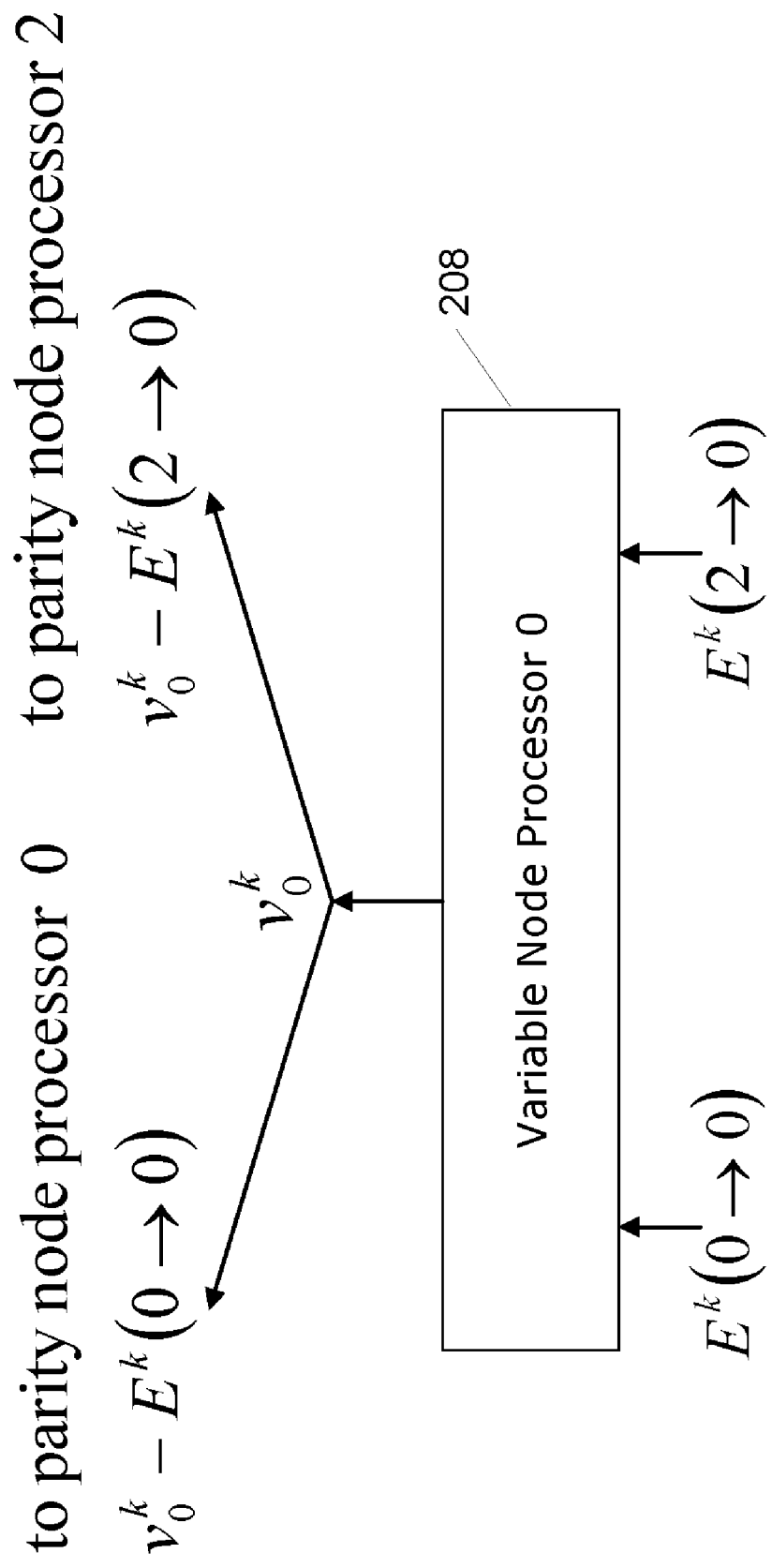
FIG. 4 is a diagram illustrating the operation of an exemplary variable node processor.
Figure 10:
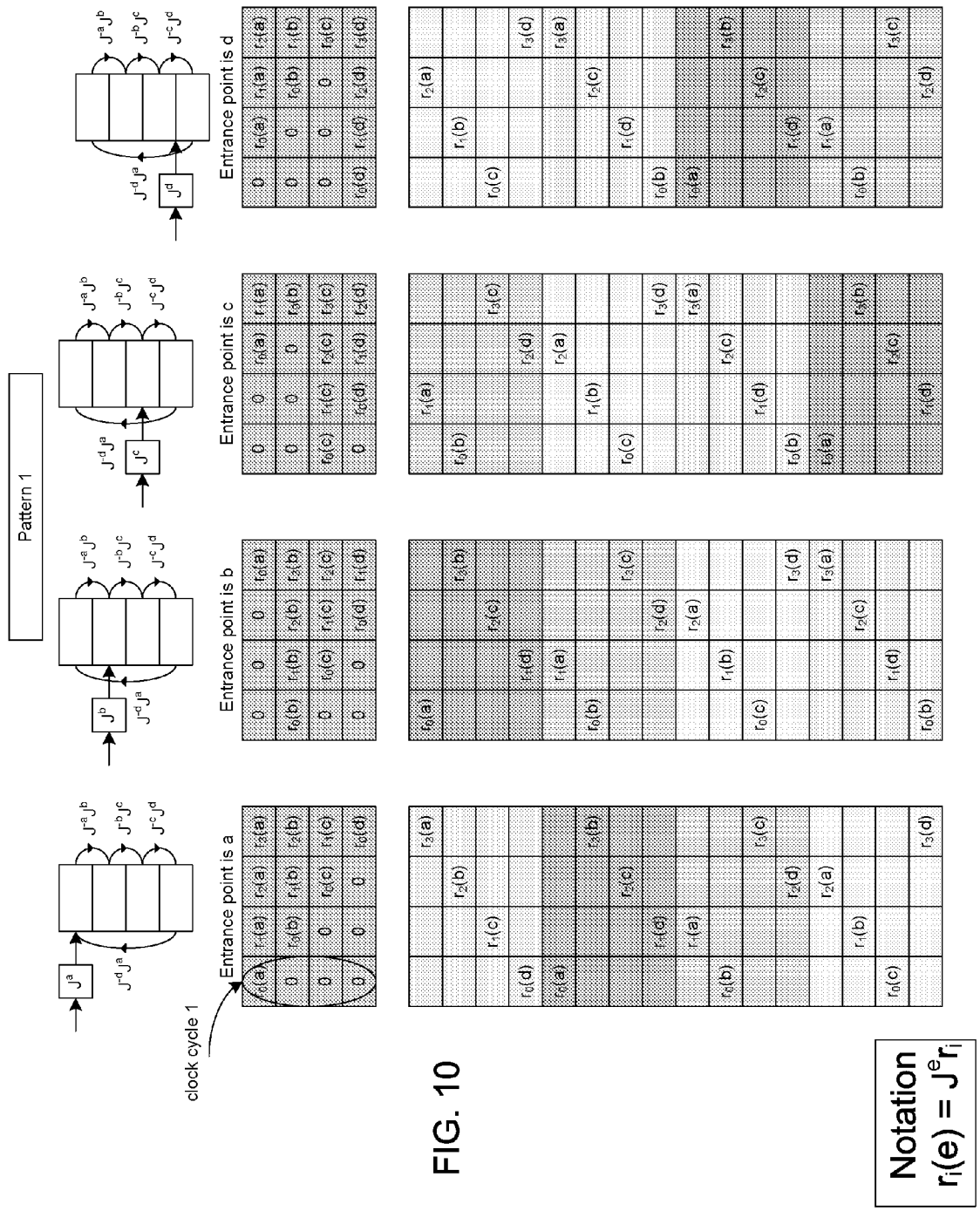
FIGS. 10-15 are diagrams illustrating the patterns used to form the sub matrices of FIG. 9.
Figure 11:
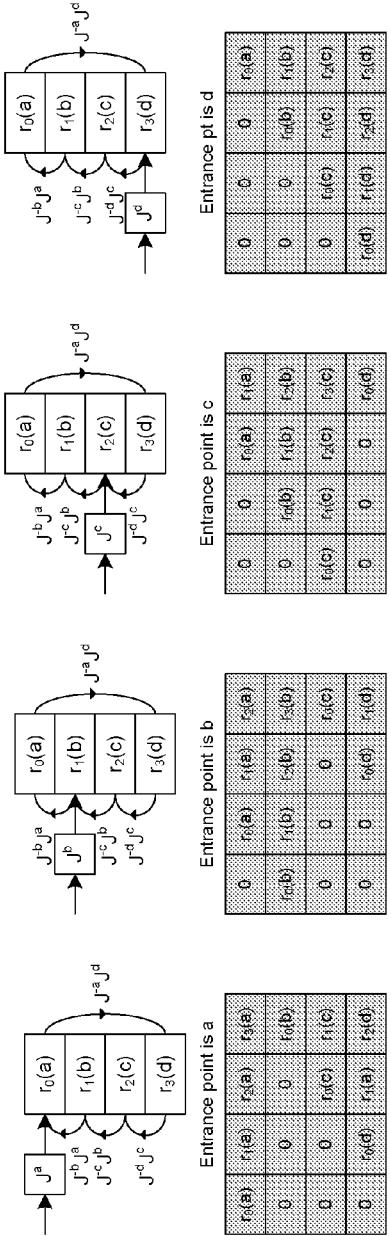
Figure 12:
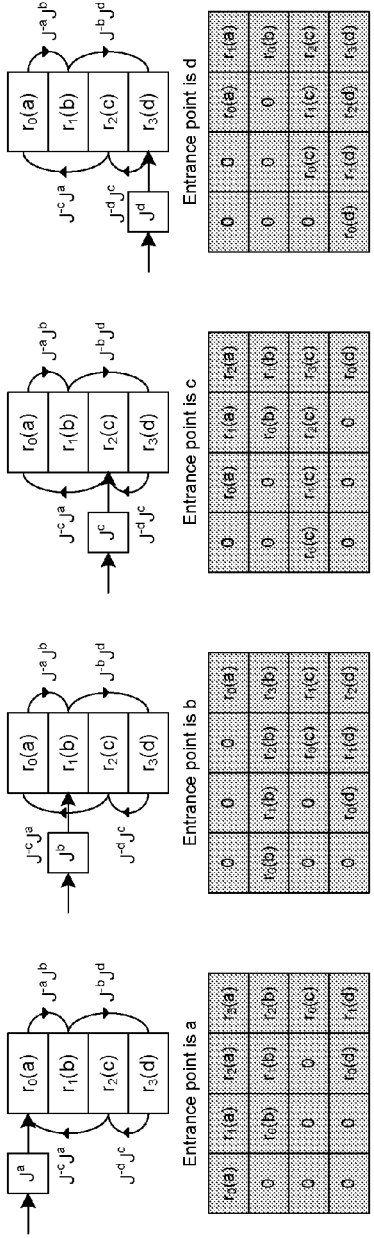
Figure 13:
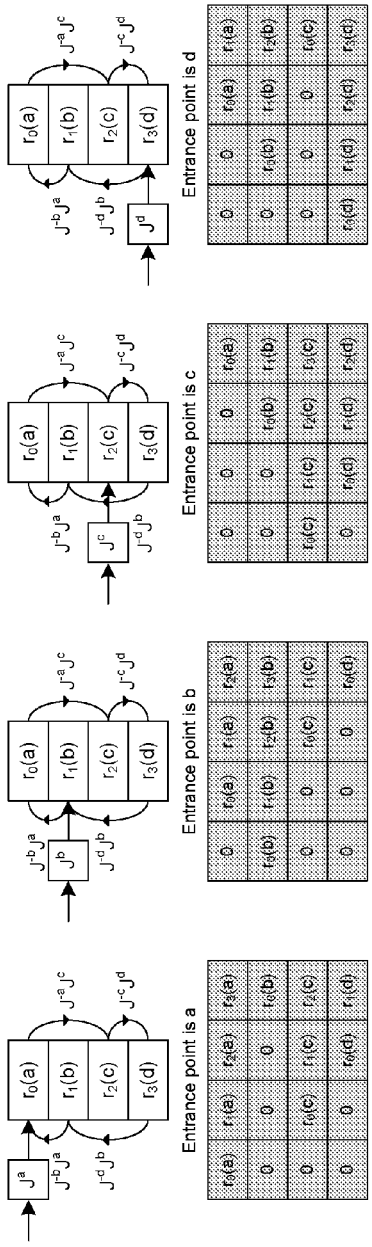
Figure 14:
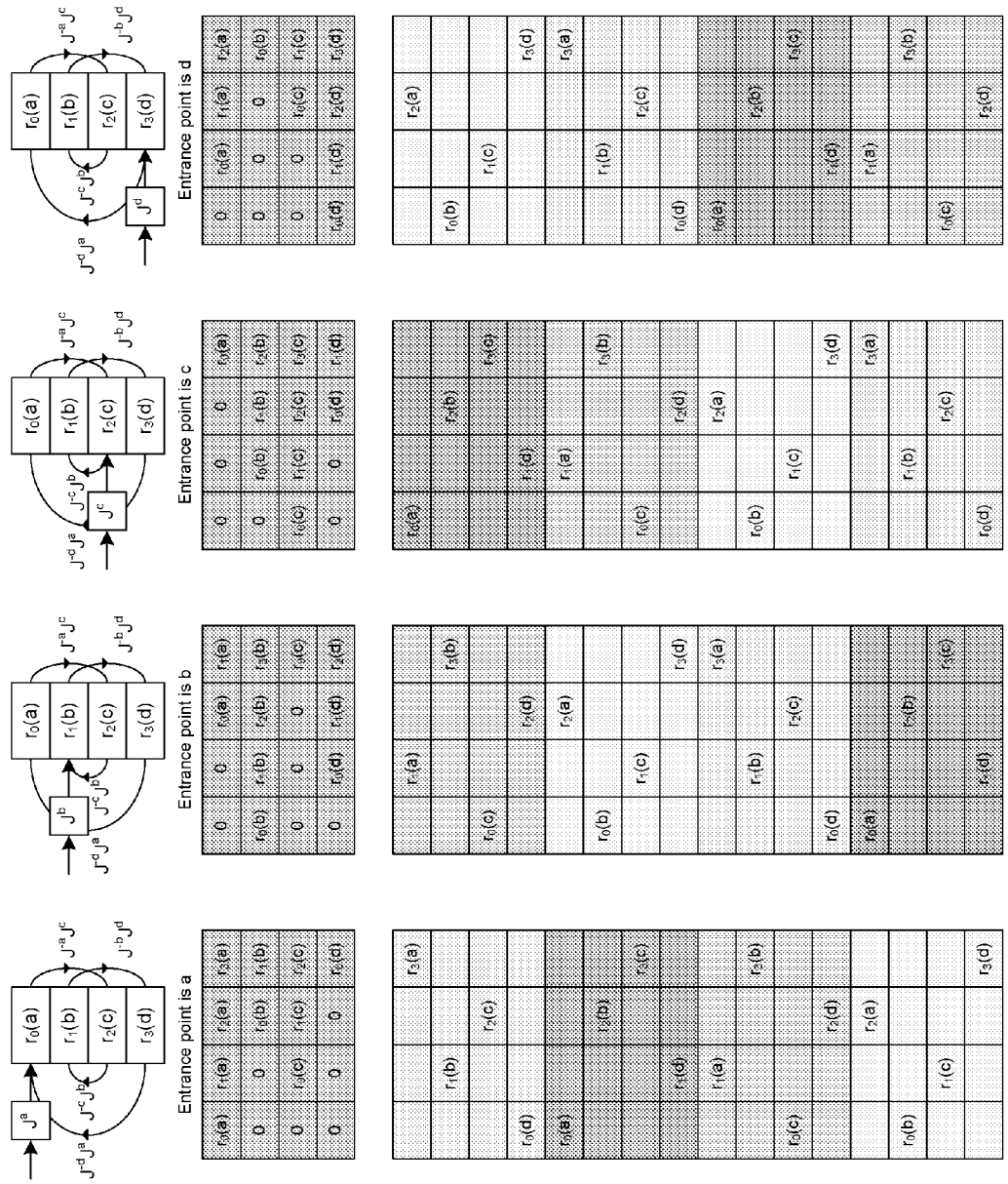
Figure 15:
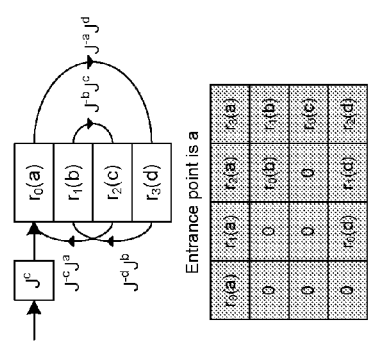

FIG. 4 is a diagram illustrating the operation of variable node processor 208. Referring to FIG. 4, variable node processor 208 receives messages from parity node processors 202 and 206 and produces variable messages to be sent back to the same parity node processors 202 and 206. In the example of FIG. 3 and FIG. 4, hard decisions are made on the multilevel variable $v^k_n$ and checked to see if they meet the parity node equations defined above. Decoding continues until there is a match, or if a predetermined number of iterations is reached.

Variable node processor 208 can be configured to implement the following equation:

$$v^k_0 = v^{k-1}_0 + E^k(0 \to 0) + E^k(2 \to 0)$$

It will be understood that the decoder described above can be implemented using hardware and/or software configured appropriately and that while separate parity check processors and variable node processors are described, these processors can be implemented by a single processor, such as a digital signal processor, or circuit, such as an Application Specific Integrated Circuit (ASIC); however, as mentioned above, implementation of an LDPC processor, such as that described with respect to FIGS. 2-4, can result in large complexity, stringent memory requirements, and interconnect complexity that can lead to bottlenecks. These issues can be exacerbated when multiple data rates are implemented. In other words, practical implementations of such a decoder can be limited.

The embodiments described below allow for more practical implementation of an LDPC decoder. For example, in one embodiment, triangular parity check matrices can be used to reduce the complexity and allow for the practical implementation of an LDPC processor configured to handle multiple data rates.

For example, in one embodiment, an LDPC processor can be configured to implement a ½ rate (Rate ½) a ¾ rate (Rate ¾), and a ⅞ Rate (Rate ⅞) in addition to the full data rate. First, the following must be defined:

Thus, for example, if the number of code bits (N) is 1152, then the number of information bits (K) will be 576, 864, and 1008, for Rate ½, Rate ¾, and Rate ⅞, respectively. These values can be determined by defining the following:

$N_{perm} = 36$;

$N_r = 4$;

$N_c = 8$;

$N_b = 4$;

$N_{base} = N_r \times N_b = 32$; and $K_{base} = N_c \times N_b = 8$.

Accordingly, N and K can be determined according to the following:

$N = N_{base} \times N_{perm}$; and $K = K_{base} \times N_{perm}$.

With the above defined, a parity check matrices $H_{12}$ can then be defined and partitioned into $K_{base} \times N_{base}$ sub-matrices. $H_{12}$ can be defined with the aid of a companion matrix $E_{12}$ as follows:

$$E_{1,2} = \begin{bmatrix} E_{1,2}(1,1) & E_{1,2}(1,2) & \cdots & E_{1,2}(1, N_{base}) \\ E_{1,2}(2,1) & E_{1,2}(2,1) & \cdots & E_{1,2}(2, N_{base}) \\ \vdots & \vdots & \ddots & \vdots \\ E_{1,2}(K_{base},1) & E_{1,2}(K_{base},1) & \cdots & E_{1,2}(K_{base}, N_{base}) \end{bmatrix};$$

and $$H_{1,2} = \begin{bmatrix} J^{E_{1,2}(1,1)} & J^{E_{1,2}(1,2)} & \cdots & J^{E_{1,2}(1,N_{base})} \\ J^{E_{1,2}(2,1)} & J^{E_{1,2}(2,2)} & \cdots & J^{E_{1,2}(2,N_{base})} \\ \vdots & \vdots & \ddots & \vdots \\ J^{E_{1,2}(K_{base},1)} & J^{E_{1,2}(K_{base},1)} & \cdots & J^{E_{1,2}(K_{base},N_{base})} \end{bmatrix}.$$

Where J is defined as the left, or right cyclic shift of the identity matrix of size $N_{perm} \times N_{perm}$ and has the following properties:

$$J^\infty = 0, \quad J^0 = I \text{ and } J^n = JJ^{n-1} \text{ and}$$

$$J^1 = \begin{bmatrix} 0 & 0 & \cdots & 0 & 0 \\ 1 & 0 & \cdots & 0 & 0 \\ 0 & 1 & 0 & \cdots & 0 \\ \vdots & \ddots & \ddots & \ddots & \vdots \\ 0 & \cdots & 0 & 1 & 0 \end{bmatrix}.$$

Figure 5:
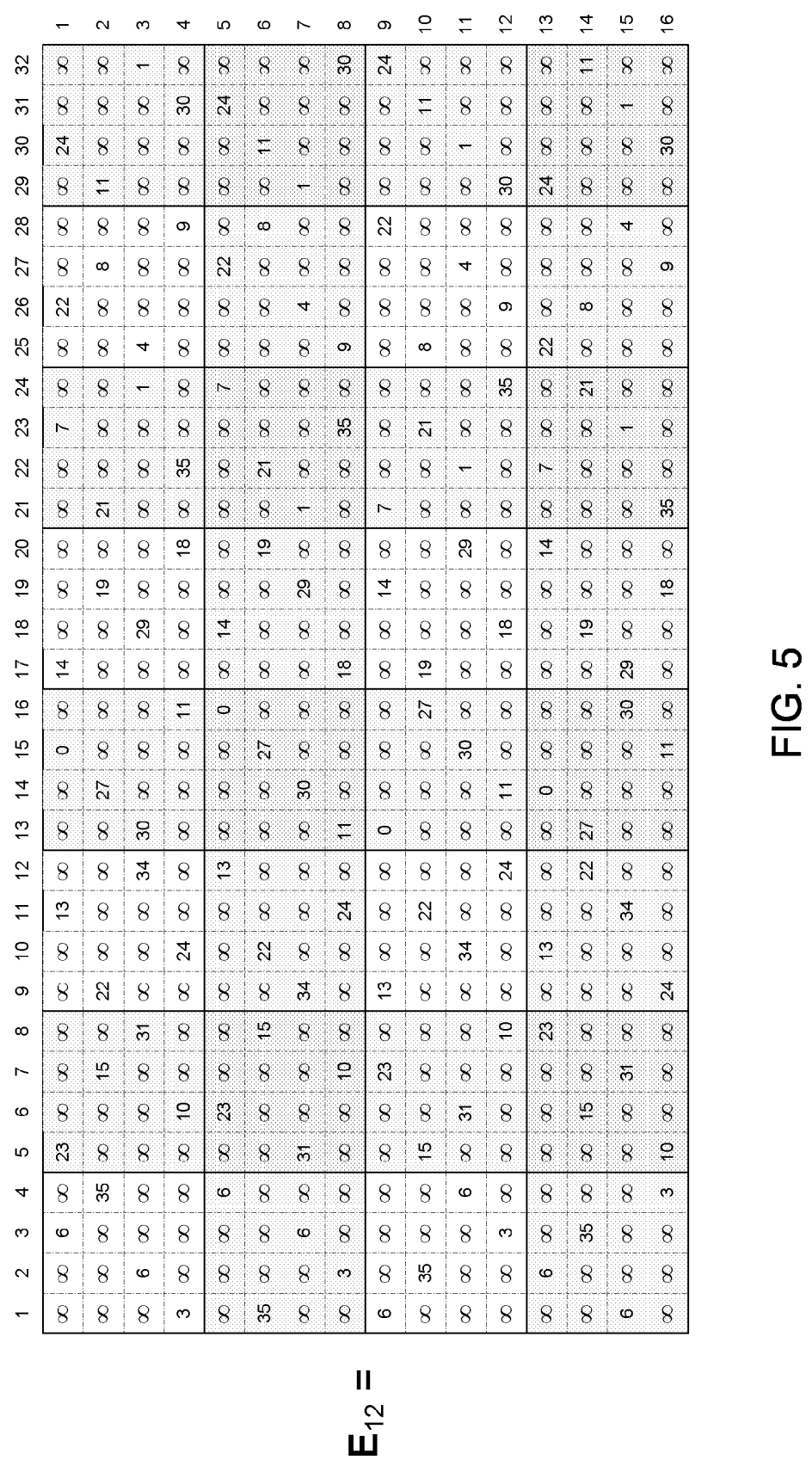
Figure 6:
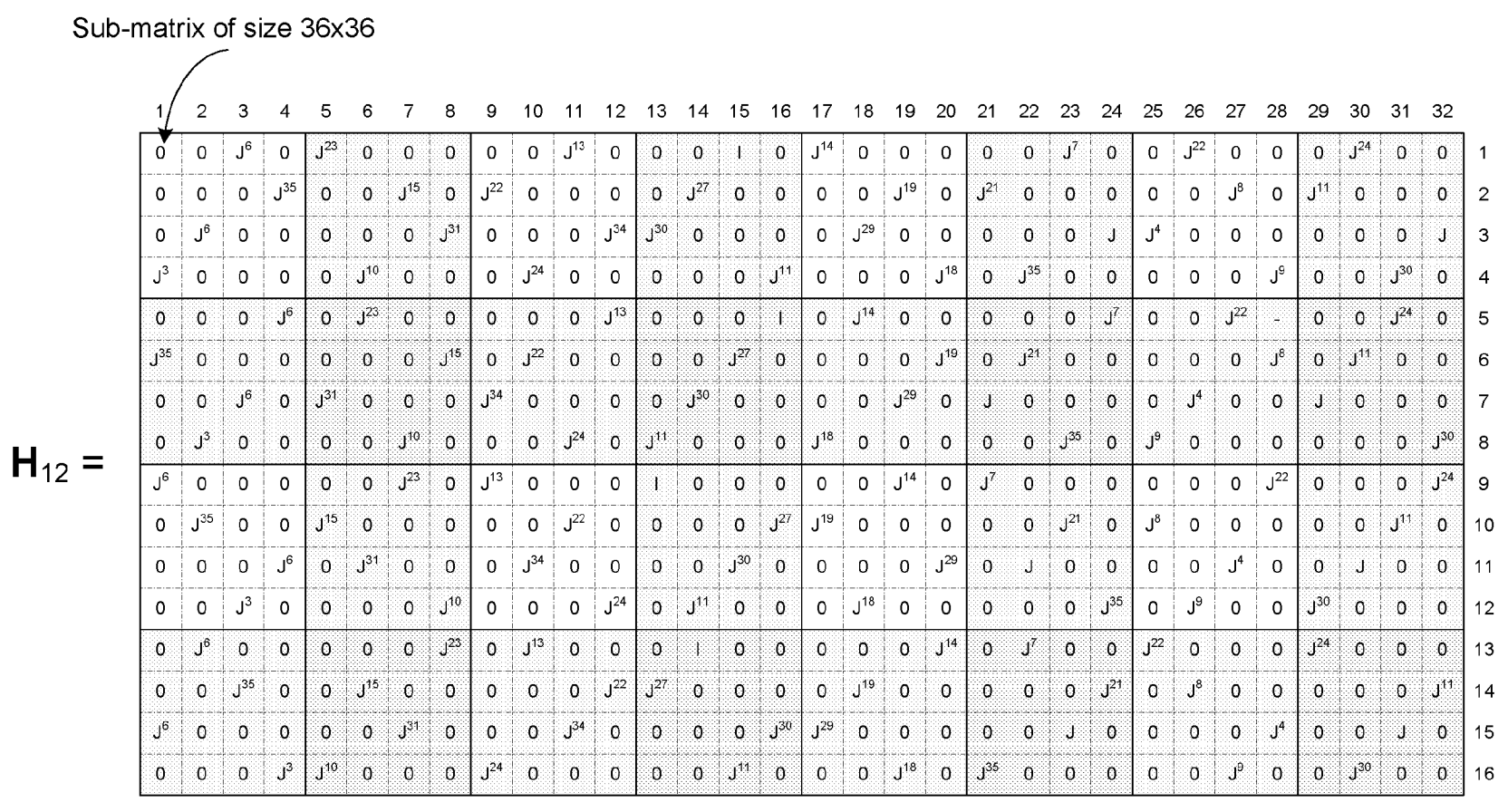

FIG. 5 and FIG. 6 illustrate an example companion matrix ($E_{12}$) and an example parity check matrix ($H_{12}$), respectively, in accordance with one embodiment. As illustrated in FIG. 6, each entry in parity check matrix ($H_{12}$) is actually a 36×36 sub matrix as explained above. The following description illustrates one example embodiment for implementing $H_{12}$ for the various data rates.

For example, to construct a parity check matrix $H_{12}$ for Rate ½, $H_{12}$ and $E_{12}$ can first be partitioned into $N_r$ sub-matrices as follows:

$$H_{12} = \begin{bmatrix} H^1_{12} \\ H^2_{12} \\ \vdots \\ H^{N_r}_{12} \end{bmatrix}, \quad E_{12} = \begin{bmatrix} E^1_{12} \\ E^2_{12} \\ \vdots \\ E^{N_r}_{12} \end{bmatrix}.$$

Sub matrices $H_{12}^1, \ldots, H_{12}^{N_r}$ correspond to supercodes $c_1, c_2, \ldots, c_{N_r}$ that act as constituent codes and allow the use of what can be termed a "turbo concept." FIG. 7 is a diagram illustrating $H_{12}^1$ for the above example.

Each sub matrix $H_{12}^i$ and $E_{12}^i$ is partitioned into $N_b$ square sub matrices as follows:

$H_{12}^i = [H_{12}^{i,1} H_{12}^{i,2} \ldots H_{12}^{i,N_c}, \text{ and}]$ $E_{12}^i = [E_{12}^{i,1} E_{12}^{i,2} \ldots E_{12}^{i,N_c}]$.

Each matrix $H^{i,j}_{12}$ and its corresponding sub-matrix $E^{i,j}_{12}$ is itself then partitioned into $N_b \times N_b$ square blocks of size $N_{perm} \times N_{perm}$, as illustrated in FIG. 8.

With respect to FIG. 8, each sub-matrix $E_{12}^{i,j}$ has one and only one non-infinity element per block row, and one and only one non-infinity element per block column. Equivalently, each sub-matrix has one and only one non-zero element per block row, and one and only one non-zero element per block column. With this construction, the parity-check equations corresponding to different rows of a sub-matrix $H_{12}^i$ are orthogonal, i.e. they involve different set of bits.

Figure 9:
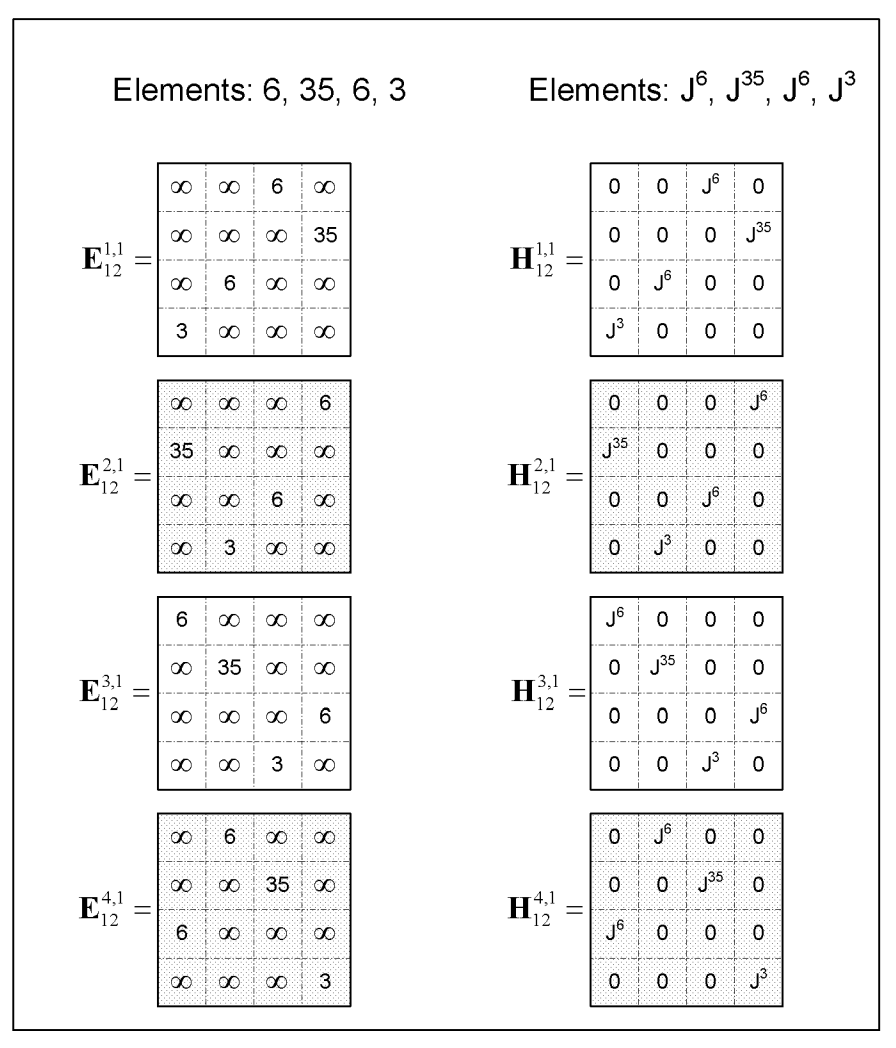

Sub-matrices $E_{12}^{1,j}, E_{12}^{2,j}, \ldots, E_{12}^{N_r,j}$ and their corresponding sub-matrices $H_{12}^{i,j}, H_{12}^{2,j}, \ldots H_{12}^{N_r,j}$ are then constructed using the same elements according to one of six patterns and one of 4 entrance points. The sub-matrices and corresponding sub-matrices thus formed are illustrated in FIG. 9. FIG. 10-15 illustrate each of the 4 entry points for each of the 6 patterns.

Figure 16:
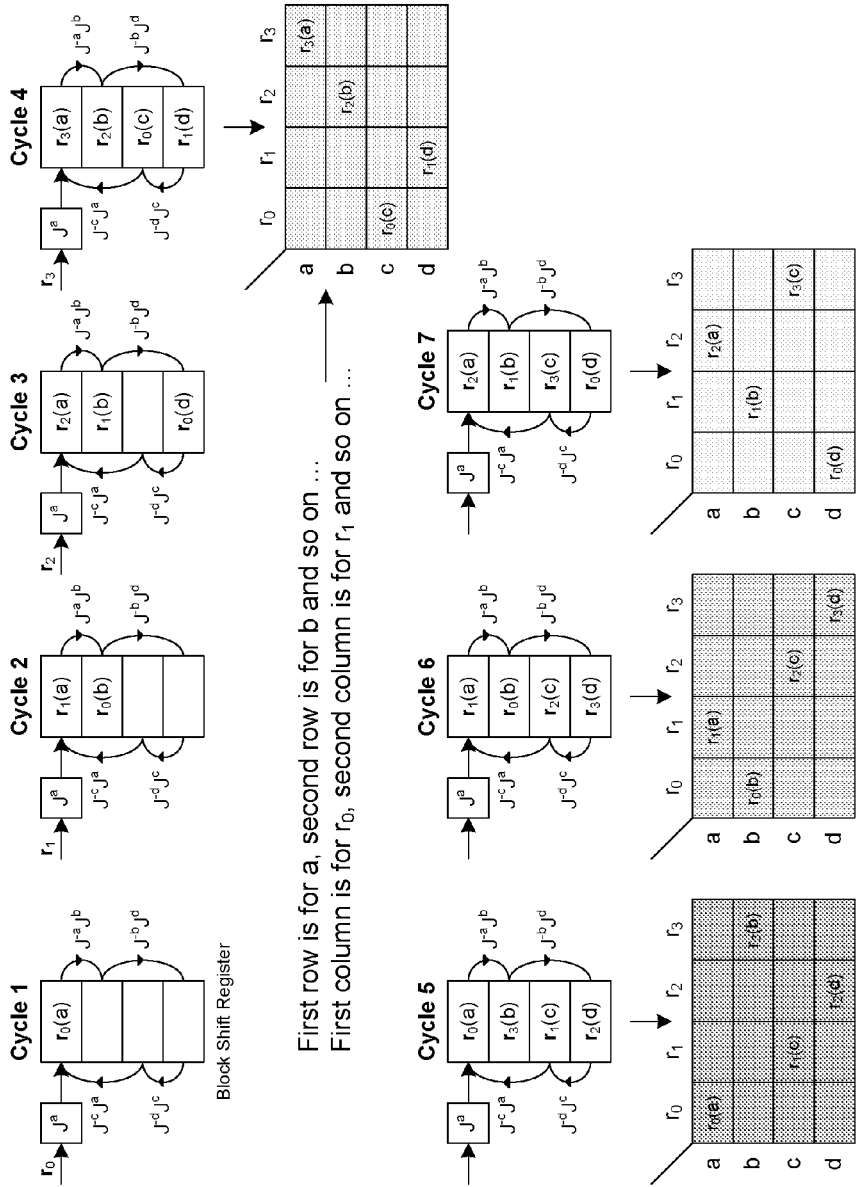
FIG. 16 is a diagram illustrating the formation of a sub-matrix using one of the patterns illustrated in FIGS. 10-15.

The top portions of FIGS. 10-15 illustrate the operation of a shift register for each of the four entry points. The tables below illustrate the results of the operation of the shift register for each entry point and the associated pattern. For example, FIG. 16 illustrates the operation of the shift register for pattern 3 and entry point a, assuming there are 4 vectors $r_0, r_1, r_2$, and $r_3$ of size $N_{perm} \times 1$ entering the shift register in that order. The top row of FIG. 16 illustrates how the shift register is filled with vector $r_0$ during the first cycle. The second row illustrates how the subsequent vectors fill the shift register during cycles 2-4.

Referring to FIG. 16, a sub-matrix is formed from the vectors by assigning the first row of the shift register to the first row of the matrix, the second row of the shift register to the second row of the matrix, etc. Further, $r_0$ will reside in the first column, r1 in the second column, etc. After the shift register is populated during cycles 1-4, then pattern 3 for entry point is completed in cycles 5, 6, and 7.

Figure 17:
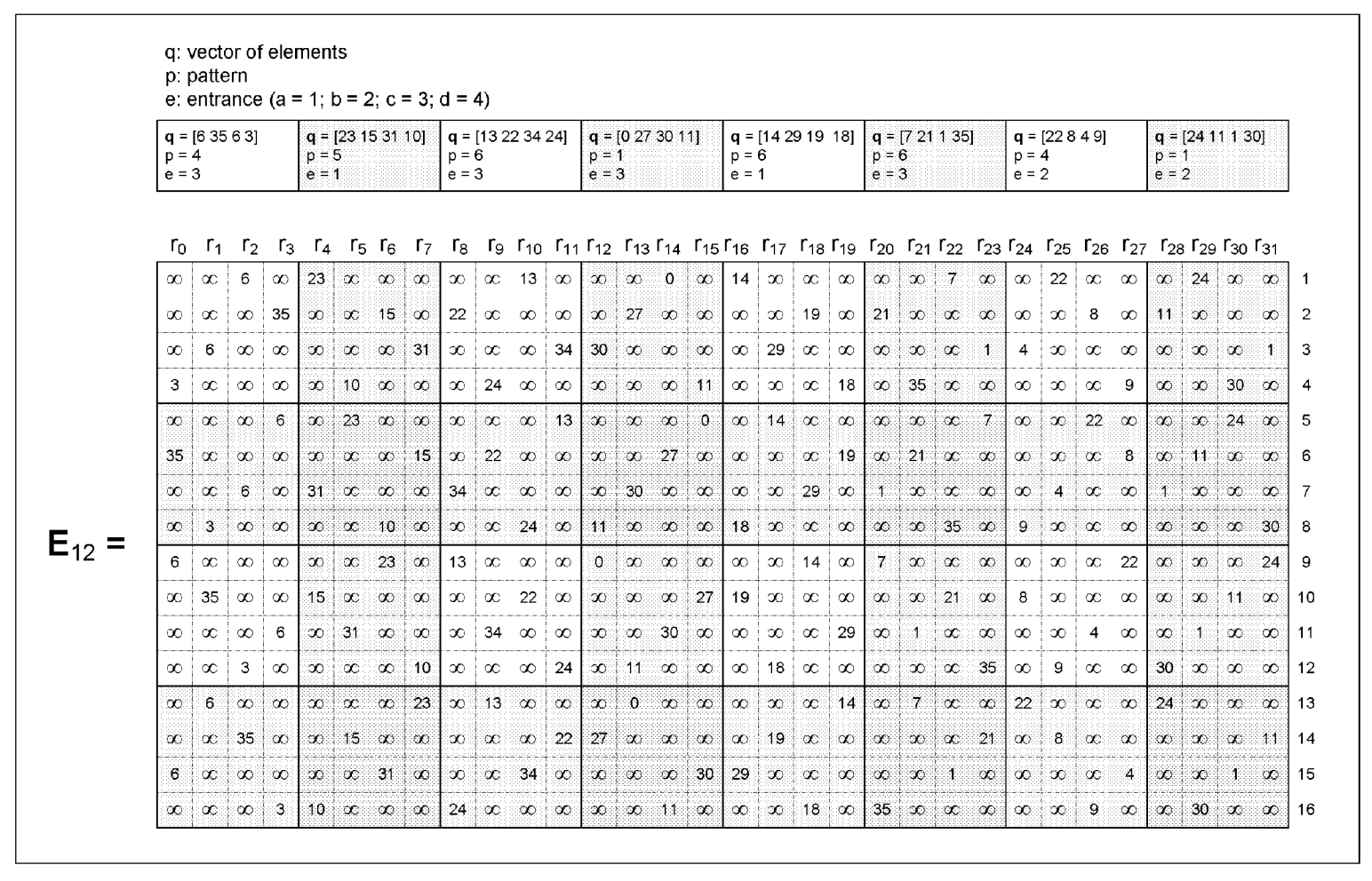

A companion matrix $E_{12}$, and therefore a parity check matrix $H_{12}$, can be defined by a vector (q) of $N_{base}$ elements, a vector (p) of $N_c$ patterns, and a vector (e) of $N_c$ entrants. FIG. 17 illustrates an example matrix $E_{12}$ formed using the following:

q={[6 36 6 3]; [23 15 31 10]; [13 22 34 24]; [0 27 30 11]; [14 29 19 18]; [7 21 1 35]; [22 8 49]; [24 11 1 30]} p={4; 5; 6; 1; 6; 6; 4; 1} e={3; 1; 3; 3; 1; 3; 2; 2}

Accordingly, a parity check matrix for Rate ¾ can be constructed using the same approach described above. For example, in one embodiment, a parity check matrix $H_{34}$ and its corresponding exponential matrix $E_{34}$ can be partitioned into $N_r$ sub-matrices as follows:

$$H_{34} = \begin{bmatrix} H_{34}^1 \\ H_{34}^2 \\ \vdots \\ H_{34q}^{N_r} \end{bmatrix}, E_{34} = \begin{bmatrix} E_{34}^1 \\ E_{34}^2 \\ \vdots \\ E_{34}^{N_r} \end{bmatrix}.$$

Each sub-matrix $H_{34}^i$ defines a supercode ci that act as a constituent code and enables the "turbo concept."

Figure 18:
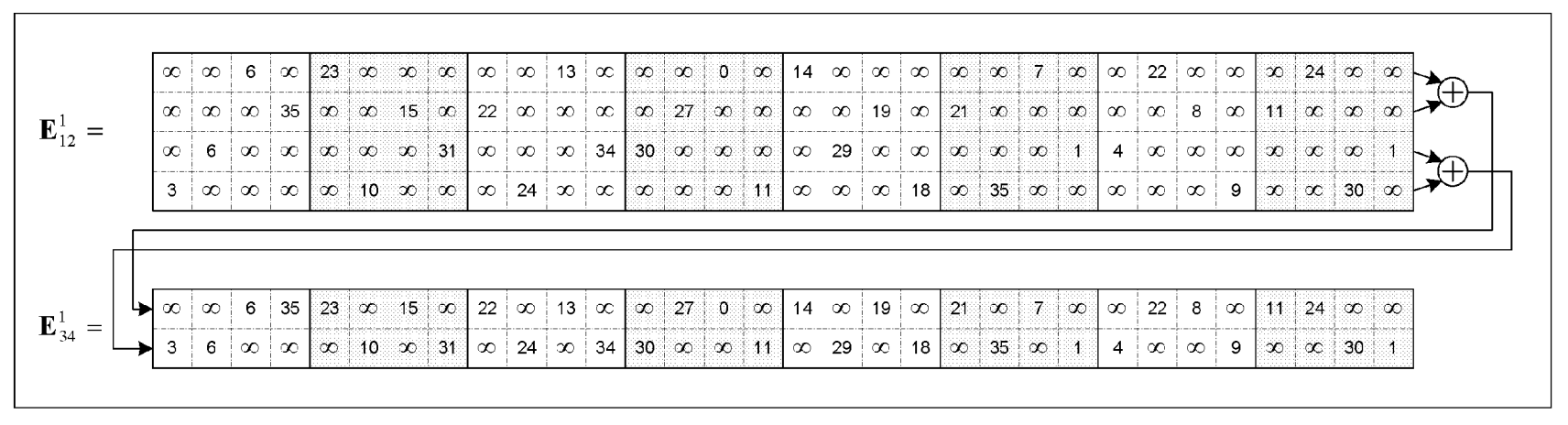
Figure 19:
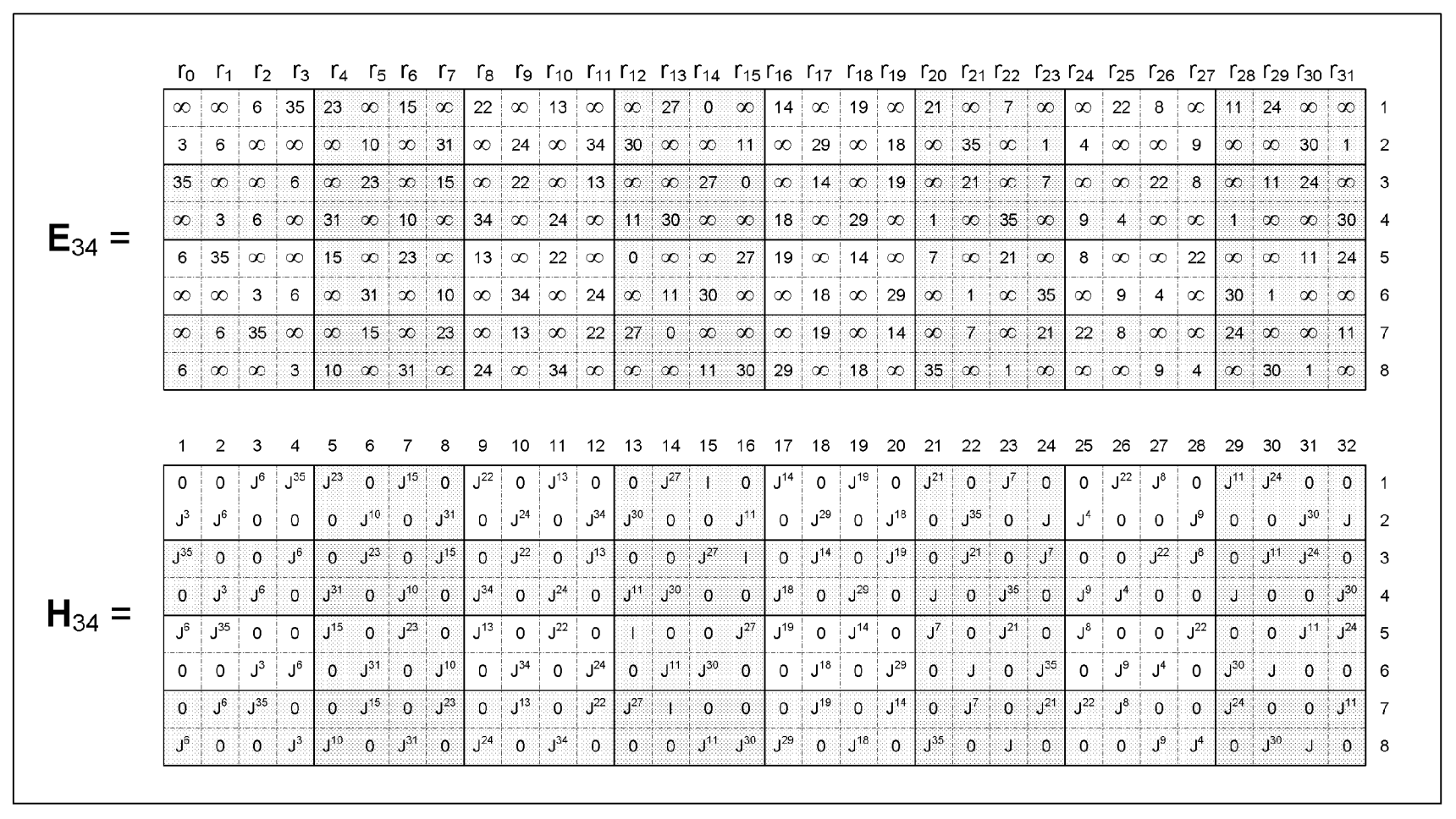

As illustrated in FIG. 18, exponent sub-matrix $E_{34}^i$ for Rate ¾ can be constructed from exponent sub-matrix $E_{12}^i$ by combining each pair of block rows into one block row. For example, exponent matrix $E_{34}$ and corresponding parity-check matrix $H_{34}$ constructed using the method described above are illustrated in FIG. 19.

Similarly, a parity check matrix for Rate ⅞ can be constructed using the same approach described above. For example, in one embodiment, a parity check matrix $H_{78}$ and its corresponding exponential matrix $E_{78}$ can be partitioned into $N_r$ sub-matrices as follows:

$$H_{78} = \begin{bmatrix} H_{78}^1 \\ H_{78}^2 \\ \vdots \\ H_{78}^{N_r} \end{bmatrix}, E_{34} = \begin{bmatrix} E_{78}^1 \\ E_{78}^2 \\ \vdots \\ E_{78}^{N_r} \end{bmatrix}.$$

Figure 20:
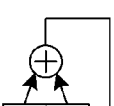
FIG. 20 is a diagram illustrating the construction of an exponential sub-matrix in accordance with one embodiment.
Figure 21:
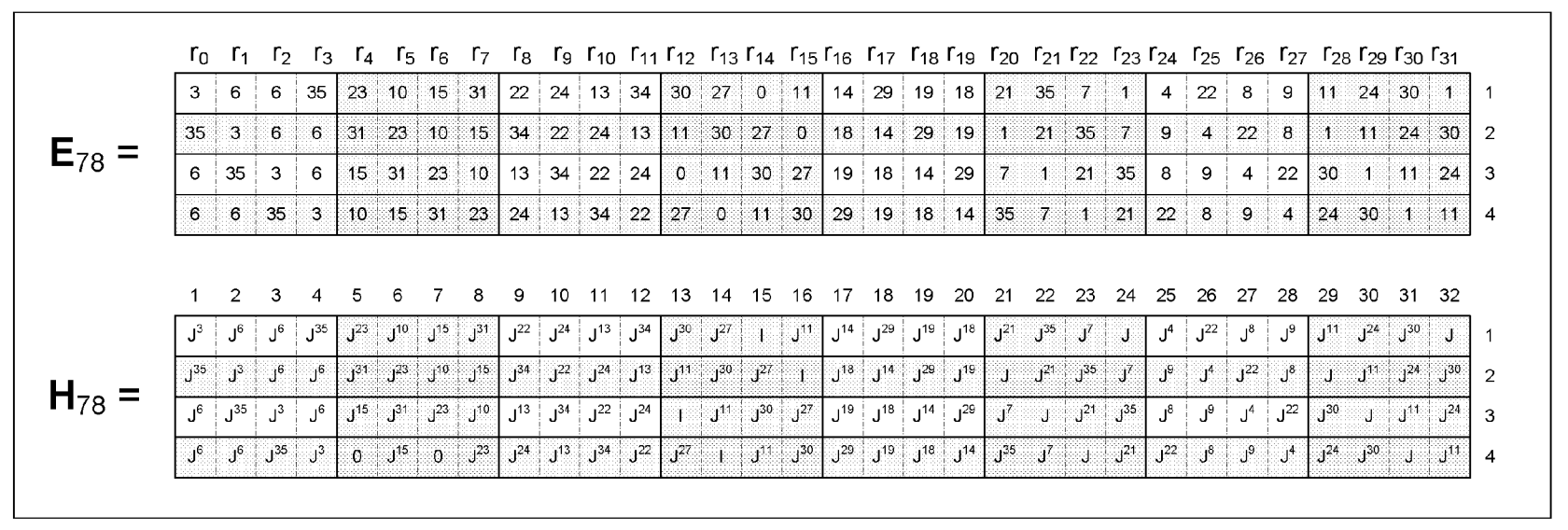

As illustrated in FIG. 20, exponent sub-matrix $E_{78}^i$ for Rate ⅞ can be constructed from exponent sub-matrix $E_{34}^i$ by combining each pair of block rows into one block row. For example, exponent matrix $E_{78}$ and corresponding parity-check matrix $H_{78}$ constructed using the method described above are illustrated in FIG. 21.

Accordingly, the methods described above can be used to implement an LPDC decoder for multiple data rates. It should be noted that in order to allow for easier encoding, the parity check matrices $H_{12}, H_{34}$, and $H_{78}$, can be modified in certain embodiments to have a triangular structure. A triangular structure is one in which all of the entries in the matrix are 0 below a diagonal line drawn through the sub-matrix. For example, each 4×4 sub-matrix in the matrices $H_{12}, H_{34}$, and $H_{78}$ shown in FIGS. 6, 19, and 21, respectively, may be configured to have a triangular structure.

While certain embodiments of the inventions have been described above, it will be understood that the embodiments described are by way of example only. Accordingly, the inventions should not be limited based on the described embodiments. Rather, the scope of the inventions described herein should only be limited in light of the claims that follow when taken in conjunction with the above description and accompanying drawings.

What is claimed is:

1. A method for forming, by an apparatus, a parity check matrix, comprising:
   generating, by the apparatus, a plurality of cyclic-shifted base matrices, and
   generating, by the apparatus, a plurality of square sub-matrices by placing the plurality of cyclic-shifted base matrices and a plurality of zero base matrices as elements of each of the plurality of sub-matrices, wherein placement of the plurality of cyclic-shifted base matrices in each square sub-matrix is defined by a pattern number and an entrance point.

2. The method of claim 1, further comprising generating a first companion exponential matrix corresponding to the parity check matrix and partitioning the first companion exponential matrix into a plurality of sub-matrices.

3. The method of claim 1, wherein each of the plurality of cyclic-shifted base matrices comprises a matrix (J) having the following properties: $J^\infty = 0, J^0 = I, J^n = JJ^{n-1}$ and J is defined as the left or right of an identity matrix.

4. The method of claim 1, wherein the sub-matrices correspond to super codes that act as constituent codes.

5. The method of claim 1, further comprising partitioning each sub-matrix into a plurality of partitioned square sub-matrices.

6. The method of claim 5, further comprising partitioning each of the plurality of partitioned square sub-matrices into square blocks.

7. The method of claim 5, wherein each square sub-matrix has one non-zero element per row and one non-zero element per column.

8. The method of claim 5, wherein each square sub-matrix is constructed using one of a plurality of patterns and one of a plurality of entry points for each of the plurality of patterns.

9. The method of claim 8, wherein the plurality of patterns comprises 6 patterns.

10. The method of claim 8, wherein the plurality of entry points comprises 4 entry points.

11. The method of claim 1, further comprising constructing a second companion exponential matrix corresponding to a second parity check matrix for a second data rate, wherein constructing the second companion exponential matrix comprises forming the second companion exponential matrix from the first companion exponential matrix.

12. The method of claim 11, wherein forming the second companion exponential matrix from the first companion exponential matrix comprises combining block rows of the first companion exponential matrix.

13. A computer-readable medium encoded with instructions executable by a processor to:
generate a plurality of cyclic-shifted base matrices, and
generate a plurality of square sub-matrices by placing the plurality of cyclic-shifted base matrices and a plurality of zero base matrices as elements of each of the plurality of sub-matrices, wherein placement of the plurality of cyclic-shifted base matrices in each square sub-matrix is defined by a pattern number and an entrance point.

14. An apparatus, comprising:
a parity check matrix generator comprising:
a base-matrix generator configured for generating a plurality of cyclic-shifted base matrices, and
a sub-matrix generator configured for generating a plurality of square sub-matrices by employing the plurality of cyclic-shifted base matrices and a plurality of zero base matrices as elements of each of the plurality of sub-matrices, wherein placement of the plurality of cyclic-shifted base matrices in each square sub-matrix is defined by a pattern number and an entrance point.

15. The apparatus of claim 14, wherein each of the plurality of square sub-matrices is constructed using one of a plurality of patterns and one of a plurality of entry points for each of the plurality of patterns.

16. The apparatus of claim 14, wherein each of the plurality of square sub-matrices comprises one non-zero element per row and one non-zero element per column.

17. An LDPC decoder comprises:
a plurality of variable-node processors configured for processing at least one of a set of signals comprising a received signal and a plurality of parity-check messages for generating a plurality of variable-node messages, and
a plurality of parity-check node processors configured for processing the plurality of variable-node messages for updating the plurality of parity-check node messages, the plurality of parity-check node processors further comprising a parity-check matrix processor configured for employing a parity-check matrix characterized by a matrix of square sub-matrices, each of the square sub-matrices comprising a plurality of matrix elements, wherein each of the plurality of matrix elements comprises either a cyclically shifted identity matrix or a zero matrix, the matrix elements being arranged such that each row and each column of each of the square sub-matrices comprises only one non-zero matrix.

18. The LDPC decoder recited in claim 17, wherein the parity-check matrix processor comprises at least one shift register configured for employing at least one of a set of patterns and at least one of a set of entrance points for generating each of the square sub-matrices.

19. The LDPC decoder recited in claim 17, wherein the parity-check matrix processor is configured with respect to a plurality of data rates.

20. An LDPC decoding method by an apparatus comprising:
generating, by the apparatus, a plurality of variable-node messages from at least one of a set of signals comprising a received signal and a plurality of parity-check messages, and
updating, by the apparatus, the plurality of parity-check node messages by processing the plurality of variable-node messages, wherein updating further comprises generating a parity-check matrix characterized by a matrix of square sub-matrices, each of the square sub-matrices comprising a plurality of matrix elements, wherein each of the plurality of matrix elements comprises either a cyclically shifted identity matrix or a zero matrix, the matrix elements being arranged such that each row and each column of each of the square sub-matrices comprises only one non-zero matrix.

21. The LDPC decoding method recited in claim 20, wherein generating the parity-check matrix employs a shift-register process configured for employing at least one of a set of patterns and at least one of a set of entrance points for generating each of the square sub-matrices.

22. The LDPC decoding method recited in claim 20, wherein generating the parity-check matrix is configured for generating a plurality of parity-check matrices with respect to a plurality of data rates.

23. A computer-readable medium encoded with instructions executable by a processor to:
generate a plurality of variable-node messages from at least one of a set of signals comprising a received signal and a plurality of parity-check messages, and
update the plurality of parity-check node messages by processing the plurality of variable-node messages, wherein updating further comprises generating a parity-check matrix characterized by a matrix of square sub-matrices, each of the square sub-matrices comprising a plurality of matrix elements, wherein each of the plurality of matrix elements comprises either a cyclically shifted identity matrix or a zero matrix, the matrix elements being arranged such that each row and each column of each of the square sub-matrices comprises only one non-zero matrix.

24. An apparatus comprising:
means for generating a plurality of cyclic-shifted base matrices, and
means for generating a plurality of square sub-matrices by placing the plurality of cyclic-shifted base matrices and a plurality of zero base matrices as elements of each of the plurality of sub-matrices, wherein placement of the plurality of cyclic-shifted base matrices in each square sub-matrix is defined by a pattern number and an entrance point.

25. An apparatus comprising:
means for generating a plurality of variable-node messages from at least one of a set of signals comprising a received signal and a plurality of parity-check messages, and
means for updating the plurality of parity-check node messages by processing the plurality of variable-node messages, wherein the updating means further comprises means for generating a parity-check matrix characterized by a matrix of square sub-matrices, each of the square sub-matrices comprising a plurality of matrix elements, wherein each of the plurality of matrix elements comprises either a cyclically shifted identity matrix or a zero matrix, the matrix elements being arranged such that each row and each column of each of the square sub-matrices comprises only one non-zero matrix.

* * * * *